United States Patent
Hertz et al.

(10) Patent No.: US 9,698,592 B2
(45) Date of Patent: Jul. 4, 2017

(54) DEVICE FOR CONNECTING TO A POWER NETWORK AND METHOD FOR PROTECTING SUCH A DEVICE

(75) Inventors: Dirk Hertz, Fichtenhof (DE); Stephan Jonas, Neunburg (DE); Norbert Reichenbach, Amberg (DE); Johann Seitz, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 325 days.

(21) Appl. No.: 14/417,809

(22) PCT Filed: Aug. 10, 2012

(86) PCT No.: PCT/EP2012/065709
§ 371 (c)(1),
(2), (4) Date: Sep. 2, 2015

(87) PCT Pub. No.: WO2014/023357
PCT Pub. Date: Feb. 13, 2014

(65) Prior Publication Data
US 2015/0372483 A1    Dec. 24, 2015

(51) Int. Cl.
*H02H 3/08* (2006.01)
*H02H 9/02* (2006.01)
(Continued)

(52) U.S. Cl.
CPC ............ *H02H 9/02* (2013.01); *H01H 85/046* (2013.01); *H02H 3/023* (2013.01); *H02H 3/08* (2013.01);
(Continued)

(58) Field of Classification Search
USPC ...................... 361/79, 86–87, 93.1
See application file for complete search history.

(56) References Cited

U.S. PATENT DOCUMENTS

| | | | | |
|---|---|---|---|---|
| 8,922,958 B2 * | 12/2014 | Ganireddy | ................ | H01T 2/02 361/2 |
| 2008/0239598 A1 * | 10/2008 | Asokan | ..................... | H01T 2/02 361/56 |

FOREIGN PATENT DOCUMENTS

| | | |
|---|---|---|
| EP | 1 544 974 A1 | 6/2005 |
| EP | 2 429 267 A1 | 3/2012 |
| GB | 1 237 312 A | 6/1971 |

OTHER PUBLICATIONS

International Search Report PCT/ISA/210 for International Application No. PCT/EP2012/065709 dated May 8, 2013.
(Continued)

*Primary Examiner* — Danny Nguyen
(74) *Attorney, Agent, or Firm* — Harness, Dickey & Pierce, P.L.C.

(57) ABSTRACT

A device for connecting to a power network includes a circuit board, a first input-side connection point, to which a first phase of the power network can be connected, a second input-side connection point, to which a second phase of the power network can be connected, and a first and second electrical conductor. The first conductor is connected to the first input-side connection point and the second conductor is connected to the second input-side connection point inside the device. The first conductor is routed as a conductor trace in an interior layer of the circuit board and includes a constriction. The second conductor is routed past the constriction such that electrical insulation existing between the constriction of the first conductor and the second conductor is destroyed in the case of a short-circuit current, to provide an electrically conductive connection between the first and second conductor exists.

32 Claims, 3 Drawing Sheets

(51) Int. Cl.
*H01H 85/046* (2006.01)
*H02H 3/02* (2006.01)
*H05K 1/02* (2006.01)
*H02H 7/08* (2006.01)
*H01H 89/06* (2006.01)

(52) U.S. Cl.
CPC ............ *H02H 7/08* (2013.01); *H05K 1/0265* (2013.01); *H01H 89/06* (2013.01); *H05K 1/0293* (2013.01); *H05K 2201/0969* (2013.01); *H05K 2201/09727* (2013.01)

(56) References Cited

OTHER PUBLICATIONS

Written Opinion of the International Searching Authority PCT/ISA/237 for International Application No. PCT/EP2012/065709 dated May 8, 2013.

\* cited by examiner

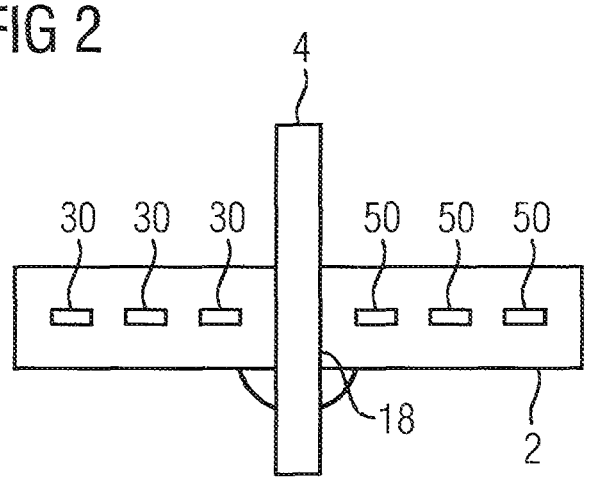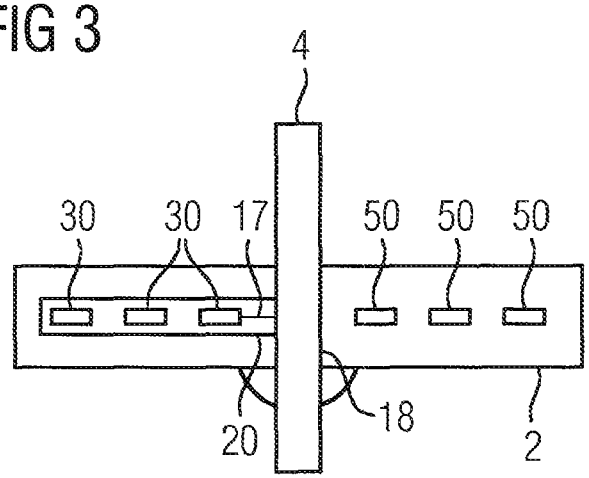

DEVICE FOR CONNECTING TO A POWER NETWORK AND METHOD FOR PROTECTING SUCH A DEVICE

PRIORITY STATEMENT

This application is the national phase under 35 U.S.C. §371 of PCT International Application No. PCT/EP2012/065709 which has an International filing date of Aug. 10, 2012, which designated the United States of America, the entire contents of which are hereby incorporated herein by reference.

FIELD

At least one embodiment of the invention generally relates to a device for connecting to a power network and/or to a method for protecting such a device. In at least one embodiment, the device comprises a circuit board, a first input-side connection point, to which a first phase of the power network can be connected, a second input-side connection point, to which a second phase of the power network can be connected, and a first and a second electrical conductor, wherein the first conductor is connected to the first input-side connection point and the second conductor to the second input-side connection point inside the device.

BACKGROUND

The power network is, in particular, a low-voltage network of an industrial plant by which a three-phase alternating current is routed to a load. The load is in particular an electrical machine, for example an electric motor.

In such an electrical plant, equipment influencing active power is conventionally used for switching, controlling and/or regulating the electric current. These may be e.g. mechanical and/or electronic switching devices to operate induction motors or resistive loads, but also inverters for variable-speed operation of motors. These can also be e.g. inverters for feeding re-generatively generated power into the power network.

For this purpose, the equipment influencing active power is connected by its input-side connection points to lines of the power network and connected by way of its output-side connection points to lines of the electrical load or, as the case may be, a power-generating unit. During operation of the plant, short-circuits may occur, if only very rarely as a rule, between the lines or within the connected load or power-generating unit.

The currents flowing in the case of a short-circuit can be very high and without additional measures can cause destruction of the equipment influencing active power, the lines and the load or power-generating units.

To prevent endangerment, associated with the destruction of plant parts, of human health and environment, appropriate overcurrent protective devices are conventionally connected upstream of the equipment influencing active power, and these switch off the short-circuit current sufficiently quickly. An overcurrent protective device is by way of example a circuit breaker. If a circuit breaker detects a short-circuit current at the power network it can interrupt the power supply for equipment connected downstream of the circuit breaker via the supply line.

The very high currents produced in the case of a short-circuit flow from the generator via the power network to the short-circuit point and are switched off very quickly by the overcurrent protective device. All lines and equipment via which the short-circuit current flows are loaded excessively heavily and partially destructively for the duration of the short-circuit. The destruction within equipment also results on circuit boards, if the short-circuit current flows via them, by the vaporization of the conductor traces or parts of components and the resulting arc and the conductive plasma.

The level of the short-circuit current is determined by the impedance of the circuit and the phase angle at the moment of its creation. The affected equipment will be destroyed depending on the short-circuit current.

In the field of industrial automation engineering care is therefore taken in the development of plant that, at the place of installation of the equipment, the maximum possible short-circuit current cannot be greater than the prospective short-circuit current with which the equipment has been tested, and that overcurrent protective devices are connected upstream of the equipment, with which this test was performed, or overcurrent protective devices are used which give rise to a lower destructive power in the equipment in the case of this prospective short-circuit current than with the tested overcurrent protective devices. A distinction is made in the choice of overcurrent protective devices between the types of protection.

In the case of protection according to classification 1, the equipment may be defective after the short-circuit but none of the electrically conductive parts of the equipment may be touched. In the case of protection according to classification 2, the equipment is undamaged and can be operated again after replacement or resetting of the overcurrent protective devices.

Since protection according to classification 2 requires expensive overcurrent protective devices, often only the more cost-effective and simple protection according to classification 1 is chosen due to the rarity of short-circuits.

Since the maximum possible level of the short-circuit current at the place of installation of the plant is often not accurately known or must first be calculated in a relative complex manner by the project engineer, project engineers prefer equipment that in the case of the simpler protection according to classification 1, in combination with a conventional overcurrent protective device, allows the highest possible, maximum possible short-circuit current at the place of installation. In this way the normally complex calculations regarding the maximum possible short-circuit current level are unnecessary and the development cost for the plant drops significantly.

SUMMARY

An embodiment of the present invention provides a highly compact device in which at least two phases of a power network are routed via a circuit board, which permits the highest possible short-circuit current, in particular according to classification 1.

A device is disclosed in at least one embodiment, i.e. a device in which the first conductor is routed as a conductor trace in an interior layer of the circuit board and has a constriction there, wherein the constriction is formed and the second conductor is routed past the constriction of the first conductor in such a manner that electrical insulation existing between the constriction of the first conductor and the second conductor is destroyed in the case of a short-circuit current via the first conductor, and therefore an electrically conductive connection between the first and second conductor exists.

A method is disclosed in an embodiment, i.e. a method for protecting a device, wherein the second conductor is electrically insulated from the constriction of the first conductor and electrical insulation existing between the constriction of the first conductor and the second conductor is destroyed in the case of a short-circuit current via the first conductor, and therefore an electrically conductive connection between the first and second conductors exists.

Advantageous developments of the invention are disclosed in the dependent claims.

BRIEF DESCRIPTION OF THE DRAWINGS

The invention and embodiments of the invention will be described and explained in more detail below with reference to the example embodiments shown in the figures, in which:

FIG. 2 shows a schematic view of the arrangement of the first, second and third conductors within a portion of the circuit board 2 of the device according to FIG. 1, FIG. 3 shows a schematic view of the arrangement according to FIG. 2 after a short-circuit current has flowed via the first conductor.

DETAILED DESCRIPTION OF THE EXAMPLE EMBODIMENTS

Figure 1:
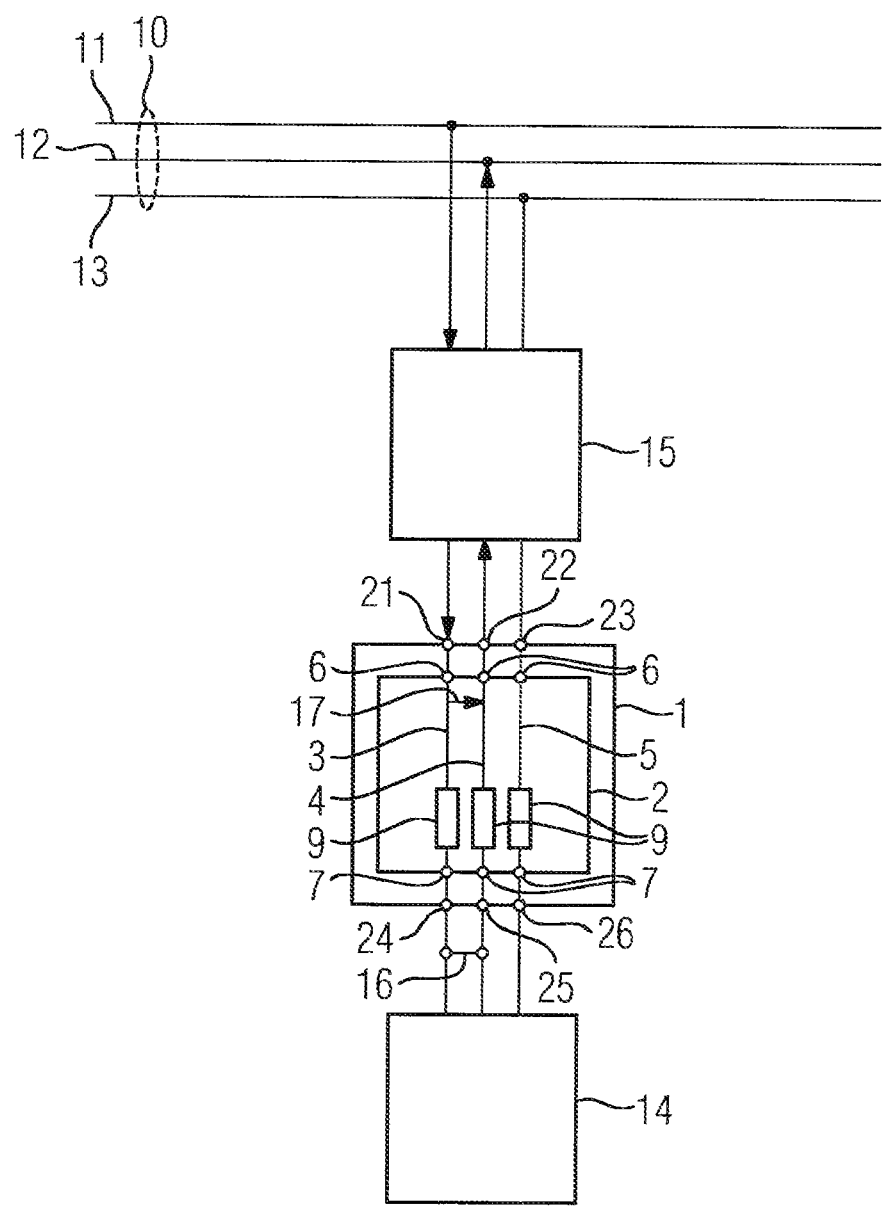
FIG. 1 shows a schematic view of an industrial plant with a load which is connected to a power network.

An advantage achieved with at least one embodiment of the invention is, in particular, that a compact device can be provided which achieves a high acceptable short-circuit current in the case of a test to classification 1.

In particular the acceptable short-circuit current of the device according to classification 1 does not lead to unacceptable damage to the device. Destruction is rated as unacceptable if the housing of the device is damaged in such a manner that inner, electrically conductive parts can be touched from the outside. Flying off of mechanical parts of the device is also undesirable.

The short-circuit current for the device being considered is always the short-circuit current acceptable for the device, in particular according to classification 1.

The power network is preferably a low-voltage network, in particular of an industrial plant. The power network is in particular a three-phase AC network.

The device comprises a housing in which the circuit board and the first and second conductors are located. The input-side first and second connection points are preferably arranged on the housing in such a manner that they are accessible from the outside so each external line can be connected via the connection point to the conductor inside the device.

The power supply is routed to a load via the first and second conductors. The power supply to the load via the conductors may preferably be controlled by way of the device. The load may be in the device or is connected downstream of the device. The load is an electrical load in particular, e.g. an electric motor.

A potential difference preferably exists between the first and second conductors during active operation of the device.

The first conductor has the constriction in its conductor trace routed in the interior layer of the circuit board, i.e. the constriction is completely enclosed by the circuit board.

In the normal operating state of the device, i.e., a correct operating current flows via the first conductor, the second line is electrically insulated from the first line. This occurs in particular by way of the circuit board in the region of the constriction.

For equipment with circuit boards in which the current is routed via conductor traces located on the outside of the circuit board, a short-circuit current usually causes sudden vaporization of parts of the circuit board. The air which has been heated very quickly and is expanding creates a pressure that can stress the equipment housing through to unacceptable mechanical destruction. Furthermore, the resulting conductive plasma can generate further short-circuit paths within the equipment which increase the short-circuit current and the harmful effect even further.

If, on the other hand, vaporization of the conductor trace takes place in an interior layer of the circuit board and if the conductor trace is dimensioned so as to be appropriately narrow, the destructive effect, caused by the vaporization of the metallic conductor and the immediately adjacent circuit board material can be drastically reduced. The fact that the constriction is routed in the interior layers of the circuit board limits destruction to the interior of the circuit board, and does not occur outwardly, or only with a reduced effect.

If an acceptable short-circuit exists for the device, so an acceptable short-circuit current flows via the first conductor, the first conductor is purposefully thermally heated at its constriction. This thermal stress results in the existing electrical insulation between the second conductor and the constriction of the first conductor being destroyed, and therefore the first conductor produces an electrically conductive connection to the second conductor in the region of the constriction for the short-circuit current. Part of the circuit board between the constriction and the second conductor is preferably vaporized by the thermal stress. There exists therefore an electrically conductive connection between the first and second conductors, and therefore the short-circuit current can flow purposefully via the first and second conductors. The auxiliary short-circuit current path artificially produced in this way generates defined short-circuit ratios and therefore leads to a reliable interruption in the power supply to the equipment by activating an upstream overcurrent protective device.

The constriction of the first conductor and the equivalent second conductor mean an auxiliary short-circuit can be purposefully generated within the device in the case of a short-circuit current via the first conductor, so downstream components of the device are not stressed by the short-circuit current. By placing the constriction within the device the location of the auxiliary short-circuit current path, and therefore the expected destruction on the first circuit board, can be purposefully determined by a short-circuit current. The circuit board can therefore be equipped accordingly, so the destruction induced by an acceptable short-circuit current does not lead to unacceptable destruction.

The constriction of the first conductor is preferably arranged in the circuit board at the beginning of the first conductor, so the thermal stress resulting due to an acceptable short-circuit current is purposefully directed to the front of the circuit board, so components on the circuit board connected downstream of the constriction are not damaged or are hardly damaged.

The constriction is therefore formed and the second conductor is arranged opposite the constriction of the first conductor in such a manner that the thermal stress on the constriction of the first conductor caused by an acceptable short-circuit current via the first line means that the electrical insulation between the constriction of the first conductor and the second conductor no longer exists for the short-circuit current.

With an acceptable short-circuit current via the first line an electrical connection is therefore intentionally generated for the short-circuit current between the first and second lines in the region of the constriction. This allows a device to be provided which is compact and optimized with respect to classification 1, moreover.

The conductor trace, routed in the interior layer of the circuit board, of the first conductor in the region of the constriction is preferably oriented orthogonally to the routed-past second conductor and/or the plated-through holes of the circuit board. The conductor trace of the first conductor in the interior layer of the circuit board and/or the longitudinal axis of the constriction of the first conductor is/are in particular oriented parallel to the largest side face of the circuit board.

The first conductor is preferably only partially routed as a conductor trace in the interior layer of the circuit board. The first conductor may be routed, by way of example, for contacting a component arranged on the circuit board on the outside of the circuit board. It is also conceivable for the first conductor to be routed shortly after the constriction on the outside of the circuit board, and to extend there.

With an acceptable short-circuit current via the first conductor there is preferably irreversible destruction inside the device, so the requirements of classification 1 are met nevertheless.

The second conductor routed past the constriction of the first conductor may be routed past the constriction of the first conductor by way of example via a plated-through hole of the circuit board.

It is also conceivable for the second conductor, likewise as a conductor trace, to have a constriction which is arranged in the interior layer and to be routed past the constriction of the first conductor with it. A short-circuit current via the first or second conductor would lead hereby to an auxiliary short-circuit current path between the constrictions of the first and second conductors.

In an advantageous embodiment of the invention, the device has a first and a second output-side connection point, wherein the first conductor produces an electrical connection inside the device between the first input-side connection point and the first output-side connection point, and the second conductor produces an electrical connection inside the device between the second input-side connection point and the second output-side connection point. During active operation of the device an electrically conductive connection can exist between the input-side and output-side connection points.

In a further advantageous embodiment of the invention, the first conductor comprises a switching element. The second conductor preferably also comprises a switching element. The switching element is in particular an electromechanical switching element and/or a semiconductor switching element.

The device is therefore a switching device by which the electrically conductive connection between the input-side and output-side connection points can be controlled.

In a further advantageous embodiment of the invention, the constriction of the first conductor is located between the first connection point and the switching element.

In a further advantageous embodiment of the invention, the constriction of the first conductor is located on the circuit board in the first 20 percent of the total length of the first conductor.

The circuit board has an input-side terminal for connecting the first conductor and an output-side terminal for releasing the first conductor.

The total length of the first conductor on the circuit board is the length of the first conductor from the input-side terminal to the output-side terminal of the circuit board.

The first conductor is preferably routed directly from the input-side terminal of the circuit board as a conductor trace in the interior layer of the circuit board.

The conductor trace of the first conductor is preferably constricted before the first conductor leaves the interior layer of the circuit board for the first time.

The first conductor is preferably constricted before the conductor trace of the first conductor contacts a component mounted on the circuit board (e.g. switching element).

In a further advantageous embodiment of the invention, the constriction of the first conductor has a length on the circuit board of at most five percent of the total length of the first conductor.

In a further advantageous embodiment of the invention, the second conductor is routed past the constriction of the first conductor via a plated-through hole of the circuit board. The second conductor is consequently routed past the constriction of the first conductor through a contact hole in the circuit board. The contact hole of the circuit board preferably has a sleeve. The sleeve is preferably metallized. The mechanical stress on the circuit board, which occurs due to the short-circuit at the constriction of the first conductor, is therefore produced at a region of the circuit board mechanically stabilized by the sleeve.

In a further advantageous embodiment of the invention, the first conductor is divided, so two or more constrictions of the first conductor exist. At least two equivalent constrictions exist therefore.

By dividing the conductor the power loss resulting during normal operation can be shared over a larger area. In addition, the force effect, caused by the short-circuit current, on the constrictions can be optimally distributed over the circuit board, so optimized destruction of the electrical insulation to the adjacent second conductor is achieved in the case of a short-circuit current via the first conductor.

The constrictions of the divided conductor are preferably routed parallel to each other within the circuit board.

The second conductor is preferably routed past between two constrictions of the first conductor.

In a further advantageous embodiment of the invention, the two constrictions of the first conductor are arranged with respect to each other in such a manner that electrical insulation existing between the constrictions through the circuit board is destroyed in the case of an acceptable short-circuit current via the first conductor.

The constrictions are electrically insulated from each other by way of the circuit board. If an acceptable short-circuit current flows via the first conductor, the circuit board is purposefully thermally stressed at the bottleneck between the constrictions in such a manner that the electrical insulation for the short-circuit current no longer exists and the auxiliary short-circuit current path is produced.

In a further advantageous embodiment of the invention, the device comprises a third input-side connection point, to which a third phase of a power network can be connected, and a third electrical conductor, with the third conductor being connected to the third input-side connection point inside the device, with the third conductor being routed as a conductor trace in the interior layer of the circuit board and having a constriction there, with the constriction of the third conductor being formed and the second and/or first conductor being routed past the constriction of the third conductor in such a manner that electrical insulation existing between the constriction of the third conductor and the second and/or first conductor is destroyed in the case of an acceptable short-circuit current via the third conductor, so an electrically conductive connection between the third conductor and the second and/or first conductor, in particular for the short-circuit current, exists.

The construction of the third conductor, in particular with respect to the constriction of the third conductor, can be analogous to the construction of the first conductor. Furthermore, the arrangement of the constriction of the third conductor relative to the second and/or first conductor(s) can be analogous to the arrangement of the constriction of the first conductor relative to the second conductor.

The third conductor can be routed by way of example with its constriction past the constriction of the first conductor, so an auxiliary short-circuit current path forms between the constrictions of the first and third conductors in the case of a short-circuit current via the first or third conductor.

In a further advantageous embodiment of the invention, the second conductor is routed past the constriction of the first and third conductors via the same plated-through hole of the circuit board.

In a further advantageous embodiment of the invention, the third conductor is routed past the constriction of the first conductor or a further constriction of the first conductor in an interior layer of the circuit board in such a manner that electrical insulation existing between the constriction or further constriction of the first conductor and the third conductor is destroyed in the case of an acceptable short-circuit current via the first conductor, and therefore an electrically conductive connection between the first and third conductors, in particular for the short-circuit current, exists.

The third conductor may be routed past the constriction of the first conductor, by way of example via a plated-through hole of the circuit board.

In a further advantageous embodiment of the invention, the third conductor in the interior layer of the circuit board has a further constriction, with the further constriction of the third conductor being formed and the first conductor being routed past the further constriction of the third conductor in such a manner that electrical insulation existing between the further constriction of the third conductor and the second or first conductor is destroyed in the case of an acceptable short-circuit current via the third conductor, and therefore an electrically conductive connection between the third conductor and the second or the first conductor, in particular for the short-circuit current, exists.

The two constrictions of the third conductor are spatially separated along its length. These are therefore not equivalent constrictions that result if the third conductor is divided.

In a further advantageous embodiment of the invention, the second conductor is routed as a conductor trace in the interior layer of the circuit board and has a constriction there, with the constriction of the second conductor being formed and the first conductor being routed past the constriction of the second conductor in such a manner that electrical insulation existing between the constriction of the second conductor and the first conductor is destroyed in the case of a short-circuit current via the second conductor, and therefore an electrically conductive connection between the second and first conductors, in particular for the short-circuit current, exists.

The construction of the second conductor, in particular its constriction, can be analogous to the construction of the first conductor. The arrangement of the constriction of the second conductor relative to the first conductor can also be analogous to the arrangement of the constriction of the first conductor relative to the second conductor.

The second conductor may be routed, by way of example with its constriction, past the constriction of the first conductor so an auxiliary short-circuit current path forms between the constrictions of the first and second conductors in the case of a short-circuit current via the first or second conductor.

The third conductor is preferably routed past the same constriction of the second conductor or a further constriction of the second conductor arranged in the interior layer of the circuit board in such a manner that electrical insulation existing between the constriction or further constriction of the second conductor and the third conductor is destroyed in the case of a short-circuit current via the second conductor, and therefore an electrically conductive connection between the second and third conductors, in particular for the short-circuit current, exists.

The current-induced thermal stress of the first, second and/or third conductor is preferably highest at its constriction in the interior layer of the circuit board inside the motor starter 1. The force effect, resulting in the case of an acceptable short-circuit current, on the device is hereby purposefully directed to the corresponding constriction of the conductor, so an auxiliary short-circuit current path to at least one adjacent conductor results within the device.

The device is preferably electrical equipment for industrial automation engineering. The device is in particular equipment influencing active power for switching, controlling and/or regulating electrical current routed via the equipment. The device is preferably a mechanical, electronic and/or electromechanical switching device, a converter or an inverter.

The device according to classification 1 preferably allows for a maximum acceptable short-circuit current of up to 55 kA via the first, second and/or third conductor(s).

In a further advantageous embodiment of the invention, there exists a system of an industrial plant. The system comprises a device as claimed in any one of claims 1 to 13, an overcurrent protective device, an electrical load and a power network system of the industrial plant. The power network is connected to the load by the device. Connected between the device and the power network is the overcurrent protective device, so this monitors the power network for short-circuits. The overcurrent protective device is in particular a circuit-breaker or a power switch.

FIG. 1 shows a schematic view of an industrial plant with a load 14 which is connected to a power network 10. The power network 10 is a low-voltage network 10 of the industrial plant. The low-voltage network comprises a first phase 11, a second phase 12, and a third phase 13. The load 14 is an electrical machine, e.g. an electric motor.

The load 14 is connected to the three-phase alternating current of the low-voltage network 10 via an overcurrent protective device 15 and a device 1. The overcurrent protective device 15 is a circuit breaker in this example embodiment. However, it can also be, for example, a power switch or motor circuit breaker.

The three phases 11,12,13 of the power network 10 are routed via the circuit breaker to the load 1. In the presence of a short-circuit in the power supply cords (the phases), the circuit breaker 15 can interrupt the power supply to the load 14. The circuit breaker 15 is a reusable safety device that does not automatically reset itself.

The device 1 is a motor starter 1 by which the power supply to the electrical load 14 can be controlled. In particular soft starting and/or soft stopping of the load 14 can occur by way of the motor starter 1. The motor starter 1 includes a first input-side connection point 21, to which the first phase 11 of the power network 10 is connected, a second input-side connection point 22, to which the second phase 12 of the power network 10 is connected, a third input-side connection point 23, to which the third phase 13 of the power network 10 is connected, a first conductor 3 which produces an electrically conductive connection to the first output-side connection point 24 as a function of the switching position of an interposed switching element 9, a second conductor 4 which produces an electrically conductive connection to the second output-side connection point 25 as a function of the switching position of an interposed switching element 9, a third conductor 5 which produces an electrically conductive connection to the third output-side connection point 26 as a function of the switching position of an interposed switching element 9, and a circuit board 2 in which the first, second and third conductors 3,4,5 are routed partly as conductor traces in an interior layer of the circuit board 2. The first, second and third lines 3,4,5 are connected to the circuit board 2 in each case by way of an input terminal 6 and an output-side terminal 7 of the circuit board 2.

The load 14 which is connected downstream of the motor starter 1 can be switched on and off by it. Switching on and off of the load 14 can be purposefully controlled by way of the motor starter 1 so a soft start or soft stop occurs at the load 14. To control the power supply to the load 12 the motor starter includes per line 3,4,5, the switching element 9 which is mounted on the circuit board 2. The switching element 9 is in each case an electromechanical switching element which has a semiconductor switching element as a bypass circuit.

The output-side connection points 24,25,26 are connected by lines to the load 14, so the load is connected to the power network 10, in particular to its phases 11,12,13. The load is therefore connected by three supply cords to the power network 10. A first supply cord connects the load 14 via the motor starter 1 and the circuit breaker 15 to the first phase 11 of the power network 10. A second supply chord connects the load 14 via the motor starter 1 and the circuit breaker 15 to the second phase 12 of the power network 10. A third supply cord connects the load 14 via the motor starter 1 and the circuit-breaker 15 to the third phase 12 of the power network 10.

The first conductor 3 of the motor starter 1 is routed via its input-side terminal 6 of the circuit board 2 as a conductor trace in the interior layer of the circuit board 2. Before the first conductor 3 is routed by an electrical part (for example, the switching element 9) mounted on a circuit board 2, the conductor trace of the first conductor 3 is constricted. In this example embodiment the conductor trace of the first conductor 3 is divided so three constrictions are produced. The current-induced thermal stress of the first conductor 3 within the motor starter 1 is highest at the constriction.

The second conductor 4 of the motor starter 1 is also routed via its input-side terminal 6 of the circuit board 2 as a conductor trace in the interior layer of the circuit board 2. Before the second conductor 4 is routed by an electrical part (for example, the switching element 9) mounted on the circuit board 2, the conductor trace of the second conductor 4 is constricted. The current-induced thermal stress of the second conductor 4 within the motor starter 1 is highest at the constriction.

The third conductor 4 of the motor starter 1 is also routed by its input-side terminal 6 of the circuit board 2 as a conductor trace in the interior layer of the circuit board 2. Before the third conductor 4 is routed by an electrical part (for example, the switching element 9) mounted on the circuit board 2, the conductor path of the third conductor 5 is constricted. In this example embodiment the conductor trace of the third conductor 5 is divided so three constrictions are produced. The current-induced thermal stress of the third conductor 5 within the motor starter 1 is highest at the constriction.

The first conductor 3 is routed past a constriction of the second and third conductors 4,5 via a plated-through hole of the circuit board 2.

The second conductor 4 is routed past a constriction of the first and third conductors 3,5 via a plated-through hole of the circuit board 2.

The third conductor 5 is routed past a constriction of the first and second conductors 3,4 via a plated-through hole of the circuit board 2.

In the normal operating state the first conductor 3 is electrically insulated from the second and third conductors 4,5 and the second conductor 4 from the third conductor 5. The constrictions of the individual conductors 3,4,5 are electrically insulated by the circuit board 2 of the adjacent conductors 3,4,5.

FIG. 2 shows a schematic view of the arrangement of the first, second and third conductors 3,4,5 within a portion of the circuit board 2 of the device according to FIG. 1. The cross-section of the circuit board 2 is shown just after the input-side terminals 6 of the circuit board 2, it being possible to see three constrictions 30 of the conductor trace of the first conductor 3, the second conductor 4 routed via a plated-through hole 18 of the circuit board 2, and the three constrictions 50 of the conductor trace of the third conductor 5.

The constrictions 30 of the first conductor are formed and the second conductor 4 is routed past one of the constrictions 30 of the first conductor 3 in such a manner that electrical insulation existing between the constrictions 30 of the first conductor 3 and second conductor 4 is destroyed in the case of an acceptable short-circuit current via the first conductor, and therefore an electrically conductive connection exists between the first and second conductors 3,4 for the short-circuit current.

The constrictions 50 of the third conductor 3 are formed and the second conductor 4 is routed past one of the constrictions 50 of the third conductor 3 in such a manner that electrical insulation existing between the constrictions 50 of the third conductor 5 and the second conductor 4 is destroyed in the case of an acceptable short-circuit current via the third conductor 5, and therefore an electrically conductive connection exists between the third and second conductors 4 for the short-circuit current.

If, as shown in the FIG. 1 by the plant short-circuit current path 16, a plant short-circuit now occurs between the first and second supply cords in the region of the connection of the motor starter 1 to the load 14, then the circuit breaker 15 is triggered with a time delay to the plant short-circuit and interrupts the power supply to the load 14.

During this time an increased short-circuit current flows via the first and second supply cords (indicated by arrows in the supply cord), so increased stressing exists for the equipment and in particular its parts and components which are connected between the power network and the plant short-circuit and are located in the first and second supply cords. Increased stress therefore occurs for the motor starter, and in particular for its first and second lines and components and parts associated with it. The short-circuit current consequently flows via the first line 6 of the motor starter 1.

The short-circuit current flowing via the first conductor 3 causes an intentional short-circuit current-induced temperature increase at the constriction 30 of the first conductor 3 such that adjacent portions 20 of the circuit board 2 vaporize and/or are destroyed, so their electrical insulation is reduced in such a manner that, as shown in FIGS. 1 and 3, an auxiliary short-circuit current path 17 is produced between the first and second lines 3, 4.

The otherwise present electrical insulation between the constrictions 30 of the first conductor 3 and second conductor 4 is deliberately destroyed by the thermal effect of the short-circuit current on the constrictions 30 of the first conductor 3, so an electrically conductive connection between the first and second conductor 4 exists for the short-circuit current. An auxiliary short-circuit current path 17 is formed. The short-circuit current can consequently escape via the second conductor 3. This is illustrated in FIGS. 1 and 3 by the auxiliary short-circuit current path 17.

The damage caused by a short-circuit can therefore be purposefully shifted into a region of the device 1 in which less damage is to be expected. Since the individual conductors 3,4,5 are routed via the circuit board the constrictions of the individual conductors are arranged in the vicinity of the input-side terminals 6 of the circuit board 2, so damage to components connected downstream on the circuit board and which are in contact with the conductors 3,4,5 is avoided.

Figure 4:
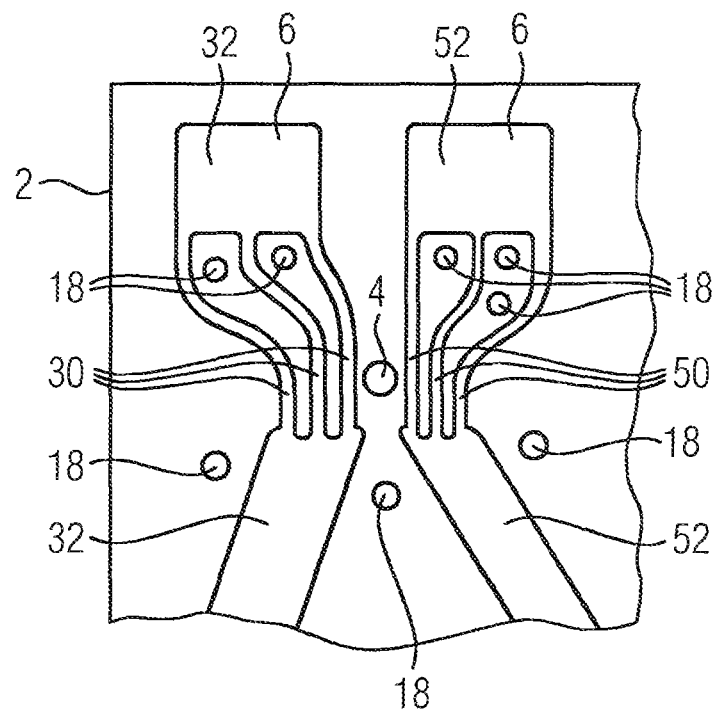
FIG. 4 shows a plan view of a sectional image of a portion of the circuit board 2 of a device according to FIG. 1.

FIG. 4 shows a plan view of a sectional image of a portion of the circuit board 2 of a device according to FIG. 1. The illustrated arrangement of FIG. 4 includes the cross-section of the circuit board 2 shown in FIG. 2.

The interior layer of the circuit board 2 is shown in which the conductor trace 32 of the first conductor 3 and the conductor trace 52 of the third conductor 5 is routed. Plated-through holes 18 of the circuit board 2 and the second conductor 4, which is routed via a plated-through hole of the circuit board 2, are also shown.

The first conductor is routed via the input-side terminal 6 of the circuit board 2 directly as a conductor trace 32 within the interior layer of the circuit board 2. Before the first conductor contacts a part mounted on the circuit board 2, the conductor trace 32 of the first conductor is divided so three constrictions 30 are produced.

The third conductor is routed via the input-side terminal 6 of the circuit board 2 directly as a conductor trace 52 within the interior layer of the circuit board 2. Before the third conductor contacts a part mounted on the circuit board 2, the conductor trace 52 of the third conductor is divided so three constrictions 30 are produced.

The constrictions 30 of the conductor trace 32 of the first conductor and second conductor 4 routed via the plated-through hole of the circuit board 2 are purposefully arranged in such a manner that electrical insulation existing through the circuit board 2 between the constriction 30 of the first conductor and the second conductor 4 is destroyed in the case of an acceptable short-circuit current via the conductor trace 32 of the first conductor, so an auxiliary short-circuit current path is produced.

The constrictions 50 of the conductor trace 52 of the third conductor and second conductor 4 routed via the plated-through hole of the circuit board 2 are purposefully arranged in such a manner that electrical insulation existing through the circuit board 2 between the constriction 50 of the third conductor and the second conductor 4 is destroyed in the case of an acceptable short-circuit current via the conductor trace 52 of the third conductor, so an auxiliary short-circuit current path is produced.

The circuit board 2, in the region of the constrictions 30,50 of the first and third conductor traces 32,52, has plated-through holes 18, so the circuit board 2 has increased mechanical stability in this region.

Figure 5:
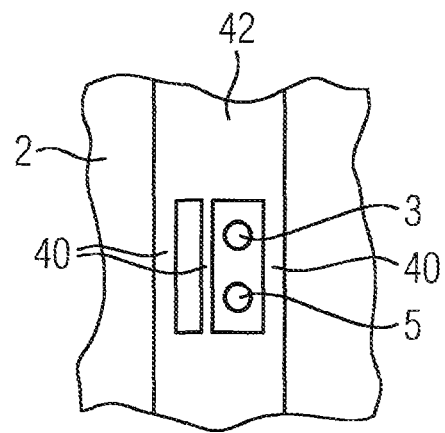
FIG. 5 is a further plan view of a sectional image of a portion of the circuit board 2 of a device according to FIG. 1.

FIG. 5 shows a further plan view of a sectional image of a portion of the circuit board 2 of a device according to FIG. 1. The interior layer of the circuit board 2 is shown in which the conductor trace 42 of the second conductor is routed. The first and third conductors 3, 5 are each routed via a plated-through hole of the circuit board 2 between two constrictions 40 of the second conductor.

The second conductor is routed as a conductor trace 42 within the interior layer of the circuit board 2. Before the second conductor contacts a part (for example, the switching element) mounted on the circuit board 2, the conductor trace 42 of the second conductor is divided so three constrictions 40 are produced.

Two of the constrictions 40 of the conductor trace 32 of the second conductor and the first and third conductors 3,5 routed via the plated-through hole of the circuit board 2 are purposefully arranged in such a manner that electrical insulation existing through the circuit board 2 between the constrictions 40 of the second conductor 4 and the first and third conductors 3,5 is destroyed in the case of an acceptable short-circuit current via the conductor trace 42 of the second conductor, so an auxiliary short-circuit current is produced.

A short-circuit at the output 24,25,26 of the device 1, the lines connected to its output 24,25,26 or in the load 14 or units generating power purposefully generate within the load 1 one or more auxiliary short-circuit current path(s) 17 to at least one further phase. The auxiliary short-circuit current path 17 is such that a predetermined, maximum possible short-circuit current (e.g. 50 kA) can be switched off by an upstream circuit breaker without leading to unacceptable destruction of the device 1 according to classification 1.

The preferred location for the auxiliary short-circuit current path 17, and therefore for the constrictions 30,40,50 of the individual conductor traces 32,42,52 of the conductors 3,4,5 is close to its input-side connection point 21,22,23 since, after the response of the auxiliary short-circuit current path 17, the remaining short-circuit current flowing through the device to the output-side connection points 24,25,26 is considerably reduced, so only slight damage to the whole of the device 1 can then develop as a result of it.

After the input-side terminal 6 of the conductor on the circuit board 2 the conductor traces 32,42,52 are divided into a plurality of constrictions 30,40,50. Due to losses these must be as short as possible. These constrictions 30,40,50 are located in the interior layers of the circuit board 2 and are led around plated-through holes 18 in at least one further conductor 3,4,5. This construction is the same for all three phases and therefore conductors 3,4,5. In the case of a short-circuit this leads to the bottlenecks of the affected conductor trace 32,42,52 between the constrictions 30,40,50 themselves and to the adjacent through-hole plating of a further conductor 3,4,5 melting and partly vaporizing. The resulting pressure leads to the insulating layer structure of the circuit board 2 being partially destroyed inside between the affected phases. In the event of a short-circuit the insulating properties of the circuit board 2 are reduced by melting in such a manner that the auxiliary phase short-circuit is possible.

Close to the input terminal an auxiliary short-circuit current path 17 therefore results which leads to the triggering of the upstream circuit breaker. The original short-circuit current flowing through the device 1 to the output terminals is therefore significantly reduced. This results in additional degrees of freedom in the circuit board design, since now the current downstream of the auxiliary short-circuit region (the constrictions 30,40,50) can be routed for example on outer traces of the circuit board again without having to fear that they will vaporize in the event of a short-circuit, with the consequence of arcing and destruction of the device.

It has proven to be advantageous to route past the constrictions next to plated-through holes 18 of THT components, since this holds the individual layers of the circuit board 2 together better and the swelling due to the vaporization of the conductor trace bottlenecks between the affected constrictions 30,40,50 is restricted to a smaller area. The effects of the short-circuit at the inlet of the device 1 can also be minimized hereby.

It is also advantageous to have the constrictions 30,40,50 run in the vicinity of plated-through holes 18 or passages of THT parts of other phases. The auxiliary short-circuit current path 17 is produced more quickly in the event of a short-circuit as a result. The short-circuit can be switched off faster and generates fewer changes in the affected region of the circuit board.

Routing the respective constriction 30,40,50 of the conductor trace 32,42,52 in the interior layers of the circuit board 2 has the advantage that the effects of the provoked auxiliary short-circuit are reduced at the input-side terminal 6 of the circuit board 2 since the short-circuit is produced in the interior layers of the circuit board 2 and not on the outside.

To master one or two phase short-circuits as well, all phases that occur in the main circuit must be combined with each other.

The purposeful displacement of the short-circuit into a defined region of the device 1 can generate an additional auxiliary short-circuit current path at constrictions of the conductors 3,4,5, so the short-circuit current does not flow through the whole device 1 any longer. As a result, the effects of the short-circuit current in the device 1 are lower. The reduced arcing in the device 1 reduces the likelihood of flash-arc to other circuits. Higher short-circuit resistance is achieved hereby, so the device 1 can be used for higher prospective short-circuit currents.

The overall volume of the device 1 can be reduced further, since, for example, encapsulation of the device 1 can be reduced or omitted.

It goes without saying that the motor starter 1 can also be a device which can actively influence the power for the load 14 connected downstream.

The invention claimed is:

1. A device for connecting to a power network, comprising:
   a circuit board;
   a first input-side connection point, to which a first phase of the power network is connectable, a second input-side connection point, to which a second phase of the power network is connectable; and
   a first and a second electrical conductor, the first conductor being connected to the first input-side connection point and the second conductor being connected to the second input-side connection point inside the device, the first conductor further being routed as a conductor trace in an interior layer of the circuit board and including a constriction, and the second conductor being routed past the constriction such that electrical insulation existing between the constriction of the first conductor and the second conductor is destroyed in the case of a short-circuit current via the first conductor, to provide an electrically conductive connection between the first and second conductor.

2. The device of claim 1, further comprising:
   a first and a second output-side connection point, the first conductor producing an electrical connection inside the device between the first input-side connection point and the first output-side connection point, and the second conductor producing an electrical connection inside the device between the second input-side connection point and the second output connection point.

3. The device of claim 1, wherein the first conductor comprises a switching element.

4. The device of claim 3, wherein the constriction of the first conductor is located between the first connection point and the switching element.

5. The device of claim 1, wherein the constriction of the first conductor is located on the circuit board in a region of a first 20 percent of a total length of the first conductor.

6. The device of claim 1, wherein the constriction of the first conductor includes a length on the circuit board of at most five percent of the total length of the first conductor.

7. The device of claim 1, wherein the second conductor is routed past the constriction of the first conductor via a plated-through hole of the circuit board.

8. The device of claim 1, wherein the first conductor is divided so two constrictions of the first conductor exist.

9. The device of claim 1, further comprising:
   a third input-side connection point, to which a third phase of a power network is connectable; and
   a third electrical conductor, wherein the third conductor is connected to the third input-side connection point inside the device, wherein the third conductor is routed as a conductor trace in an interior layer of the circuit board and including a constriction, at least one of the second and first conductor being routed past the constriction of the third conductor such that electrical insulation existing between the constriction of the third conductor and the at least one of the second and first conductor is destroyed in the case of a short-circuit current via the third conductor, to provide an electrically conductive connection between the third conductor and the at least one of the first and second conductor exists.

10. The device of claim 9, wherein the second conductor is routed past the constriction of the first and third conductors via the same plated-through hole of the circuit board.

11. The device of claim 9, wherein the third conductor is routed past the constriction of the first conductor or a further constriction of the first conductor in an interior layer of the circuit board such that electrical insulation existing between the constriction or further constriction of the first conductor and the third conductor is destroyed in the case of a short-circuit current via the first conductor, to provide an electrically conductive connection between the first and third conductors exists.

12. The device of claim 9, wherein the third conductor in the interior layer of the circuit board comprises a further constriction, wherein the first conductor is routed past the further constriction of the third conductor such that electrical insulation existing between the further constriction of the third conductor and the second or first conductor is destroyed in the case of a short-circuit current via the third conductor, to provide an electrically conductive connection between the third conductor and the second or the first conductor.

13. The device of claim 1, wherein the second conductor is routed as a conductor trace in the interior layer of the circuit board and includes a constriction, wherein the first conductor is routed past the constriction of the second conductor such that electrical insulation existing between the constriction of the second conductor and the first conductor is destroyed in the case of a short-circuit current via the second conductor, to provide an electrically conductive connection between the second and first conductors.

14. A system comprising:
the device of claim 1;
an overcurrent protective device;
an electrical load; and
a power network of an industrial plant, wherein the power network is connected by the overcurrent protective device and the device connected downstream of the overcurrent protective device to the electrical load.

15. A method for protecting a device comprising a circuit board; a first input-side connection point, to which a first phase of the power network is connectable, a second input-side connection point, to which a second phase of the power network is connectable; and a first and a second electrical conductor, the first conductor being connected to the first input-side connection point and the second conductor being connected to the second input-side connection point inside the device, the first conductor further being routed as a conductor trace in an interior layer of the circuit board and including a constriction, and the second conductor being routed past the constriction such that electrical insulation existing between the constriction of the first conductor and the second conductor is destroyed in the case of a short-circuit current via the first conductor, to provide an electrically conductive connection between the first and second conductor, the method comprising:
electrically insulated the second conductor from the constriction of the first conductor; and
destroying electrical insulation existing between the constriction of the first conductor and the second conductor in the case of a short-circuit current via the first conductor, to provide an electrically conductive connection between the first and second conductors.

16. The device of claim 2, wherein the first conductor comprises a switching element.

17. The device of claim 16, wherein the constriction of the first conductor is located between the first connection point and the switching element.

18. The device of claim 2, wherein the constriction of the first conductor is located on the circuit board in a region of a first 20 percent of a total length of the first conductor.

19. The device of claim 2, further comprising:
a third input-side connection point, to which a third phase of a power network is connectable; and
a third electrical conductor, wherein the third conductor is connected to the third input-side connection point inside the device, wherein the third conductor is routed as a conductor trace in an interior layer of the circuit board and including a constriction, at least one of the second and first conductor being routed past the constriction of the third conductor such that electrical insulation existing between the constriction of the third conductor and the at least one of the second and first conductor is destroyed in the case of a short-circuit current via the third conductor, to provide an electrically conductive connection between the third conductor and the at least one of the first and second conductor exists.

20. The device of claim 19, wherein the second conductor is routed past the constriction of the first and third conductors via the same plated-through hole of the circuit board.

21. The device of claim 10, wherein the third conductor is routed past the constriction of the first conductor or a further constriction of the first conductor in an interior layer of the circuit board such that electrical insulation existing between the constriction or further constriction of the first conductor and the third conductor is destroyed in the case of a short-circuit current via the first conductor, to provide an electrically conductive connection between the first and third conductors exists.

22. The device of claim 19, wherein the third conductor is routed past the constriction of the first conductor or a further constriction of the first conductor in an interior layer of the circuit board such that electrical insulation existing between the constriction or further constriction of the first conductor and the third conductor is destroyed in the case of a short-circuit current via the first conductor, to provide an electrically conductive connection between the first and third conductors exists.

23. The device of claim 20, wherein the third conductor is routed past the constriction of the first conductor or a further constriction of the first conductor in an interior layer of the circuit board such that electrical insulation existing between the constriction or further constriction of the first conductor and the third conductor is destroyed in the case of a short-circuit current via the first conductor, to provide an electrically conductive connection between the first and third conductors exists.

24. The device of claim 10, wherein the third conductor in the interior layer of the circuit board comprises a further constriction, wherein the first conductor is routed past the further constriction of the third conductor such that electrical insulation existing between the further constriction of the third conductor and the second or first conductor is destroyed in the case of a short-circuit current via the third conductor, to provide an electrically conductive connection between the third conductor and the second or the first conductor.

25. The device of claim 11, wherein the third conductor in the interior layer of the circuit board comprises a further constriction, wherein the first conductor is routed past the further constriction of the third conductor such that electrical insulation existing between the further constriction of the third conductor and the second or first conductor is destroyed in the case of a short-circuit current via the third conductor, to provide an electrically conductive connection between the third conductor and the second or the first conductor.

26. The device of claim 19, wherein the third conductor in the interior layer of the circuit board comprises a further constriction, wherein the first conductor is routed past the further constriction of the third conductor such that electrical insulation existing between the further constriction of the third conductor and the second or first conductor is destroyed in the case of a short-circuit current via the third conductor, to provide an electrically conductive connection between the third conductor and the second or the first conductor.

27. The device of claim 22, wherein the third conductor in the interior layer of the circuit board comprises a further constriction, wherein the first conductor is routed past the further constriction of the third conductor such that electrical insulation existing between the further constriction of the third conductor and the second or first conductor is destroyed in the case of a short-circuit current via the third conductor, to provide an electrically conductive connection between the third conductor and the second or the first conductor.

28. The device of claim 23, wherein the third conductor in the interior layer of the circuit board comprises a further constriction, wherein the first conductor is routed past the further constriction of the third conductor such that electrical insulation existing between the further constriction of the third conductor and the second or first conductor is destroyed in the case of a short-circuit current via the third conductor, to provide an electrically conductive connection between the third conductor and the second or the first conductor.

29. The device of claim 2, wherein the second conductor is routed as a conductor trace in the interior layer of the circuit board and includes a constriction, wherein the first conductor is routed past the constriction of the second conductor such that electrical insulation existing between the constriction of the second conductor and the first conductor is destroyed in the case of a short-circuit current via the second conductor, to provide an electrically conductive connection between the second and first conductors.

30. The device of claim 9, wherein the second conductor is routed as a conductor trace in the interior layer of the circuit board and includes a constriction, wherein the first conductor is routed past the constriction of the second conductor such that electrical insulation existing between the constriction of the second conductor and the first conductor is destroyed in the case of a short-circuit current via the second conductor, to provide an electrically conductive connection between the second and first conductors.

31. A system comprising:
   the device of claim 2;
   an overcurrent protective device;
   an electrical load; and
   a power network of an industrial plant, wherein the power network is connected by the overcurrent protective device and the device connected downstream of the overcurrent protective device to the electrical load.

32. A system comprising:
   the device of claim 9;
   an overcurrent protective device;
   an electrical load; and
   a power network of an industrial plant, wherein the power network is connected by the overcurrent protective device and the device connected downstream of the overcurrent protective device to the electrical load.

* * * * *